OPTO-ELECTRONIC SEMICONDUCTOR JUNCTION DEVICE
Filed Aug. 14, 1964
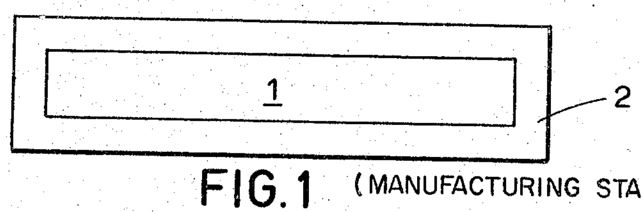
FIG. 1 (MANUFACTURING STAGE)
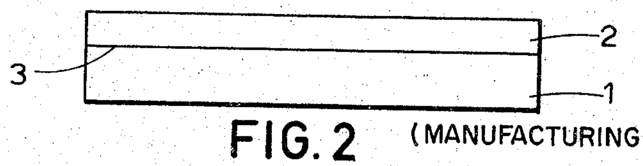
FIG. 2 (MANUFACTURING STAGE)
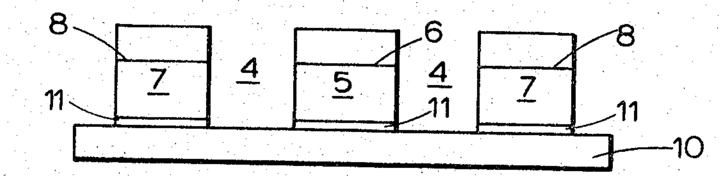
FIG. 3 (MANUFACTURING STAGE)
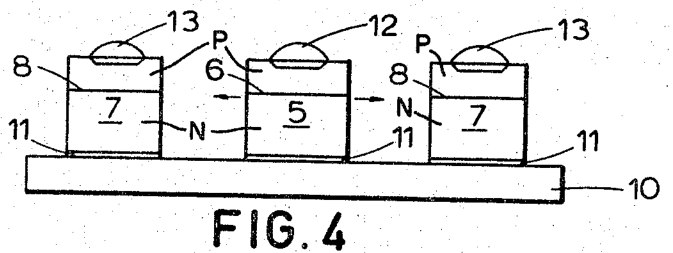
FIG. 4
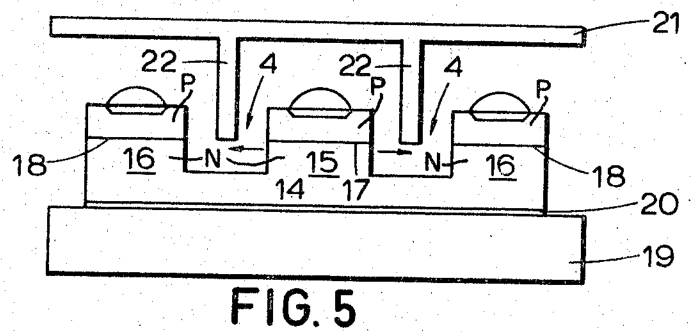
FIG. 5
INVENTORS
JULIAN R. A. BEALE
ANDREW F. BEER
PETER C. NEWMAN
BY Frank R. Trifari
AGENT United States Patent Office 3,319,068
Patented May 9, 1967

3,319,068

OPTO-ELECTRONIC SEMICONDUCTOR JUNCTION DEVICE

Julian Robert Anthony Beale, Reigate, Surrey, and Andrew Francis Beer and Peter Colin Newman, Crawley, Sussex, England, assignors to North American Philips Co., Inc., New York, N.Y., a corporation of Delaware Filed Aug. 14, 1964, Ser. No. 389,618
Claims priority, application Great Britain, Aug. 15, 1963, 32,316/63
6 Claims. (Cl. 250—217)

This invention relates to opto-electronic semiconductor devices.

In the semiconductor art semiconductor bodies comprising p-n junctions capable of emitting photons when suitably biased in the forward direction are known per se. It is also known that such photon-emissive p-n junctions are capable of transforming electrical energy into photons with a high quantum efficiency. Thus, when a gallium arsenide p-n junction is suitably biased in the forward direction radiative recombination occurs, the photon energy being approximately that of the band gap of gallium arsenide. In a letter from R. J. Keyes and T. M. Quist, published in "Proceedings I.R.E.," August 1962, vol. 50, No. 8, pages 1822–1823 the emission of intense line radiation from a gallium arsenide p-n junction is described and it is stated that it may be possible to fabricate diodes in which for almost every injected charge carrier a photon is emitted. A verification that efficient generation of light modulated at microwave frequencies is possible is reported in a letter from J. I. Pankove and J. E. Berkeyheiser, published in "Proceedings I.R.E.," September 1962, vol. 50, No. 9, pages 1976–1977. This letter also states that in a suitably forward biased gallium arsenide p-n junction the quantum efficiency is from 0.50 to 1.00. The term quantum efficiency means the average number of photons emitted for each charge carrier crossing the p-n-junction.

It is further known that as solid-state photo-detectors with response at the said frequencies p-n- photo-diodes can be used if the emitted infra-red radiation is absorbed very close to the p-n junction of the photo-diode. Thus as an extension of this principle, in a letter from R. F. Rutz published in "Proceedings I.E.E.E.," March 1963, page 470, it is reported that the high efficiency, narrow band recombination radiation emitted from a forward biased zinc diffused gallium arsenide diode can be quite efficiently collected by a similar junction biased in the reverse direction and located in the same crystal wafer.

According to the invention an opto-electronic semiconductor device comprises the combination in a structural unit of a first semiconductor body part having a first, photon-emissive p-n junction capable of emitting photons when suitably biased in the forward direction, a second semiconductor body part having a second, photo-sensitive p-n-junction capable of transforming the energy of photons emanating from the first p-n-junction to that of charge carriers at the second p-n-junction and mechanical modulation means for modulating the incidence of the available photon emission on the second p-n-junction.

By modulating the incidence of the available photon-emission on the second p-n-junction the current through this junction may be modulated and by suitable arrangement of the mechaniacl modulation means with respect to the first and second semiconductor body parts in the combination the device may be readily constructed as a microphone, gramophone pickup, pressure sensing element, transmitting or signalling arrangement.

The photon-emission from the first p-n junction occurs over a small area in the vicinity of the junction. To obtain a highly sensitive device in which the current through the second p-n junction is modulated in accordance with the modulation of the incidence of the available photon emission on the second p-n junction it is a basic requirement that the emission shall have a small angular spread. In Physical Review Letters, volume 9, No. 9, Nov. 1 1962, in an article by R. N. Hall et al. on pages 366 to 368, the observation of coherent infra-red radiation from forward biased gallium arsenide p-n-junctions in pulsed operation at 77° K. is reported. Similarly in Applied Physics Letters, vol 1, No. 3, Nov. 1, 1962, in an article by M. I. Nathan et al. on pages 62 and 64, the narrowing of an emission line as the excitation is increased which is characteristic of stimulated emission of radiation, from a forward biased gallium aresnide p-n junction is reported. In Applied Physics Letters, vol. 1, No. 4, of Dec. 1, 1962, in an article by T. M. Quist et al. the authors report obtaining coherent radiation from GaAs diodes at 77° K. and greatly improved performance at 4.2° K. This letter article also reports the observation above the threshold of a very intense and narrow beam radiating from the junction region in the horizontal plane of the junction with a vertical half-power beamwidth of less than 10°. In general, when such a forward biased p-n junction is operated in such a manner as to obtain coherent radiation then this radiation lies in the direction of the junction plane and is of small angular spread. Thus the aforesaid requirement of the device according to the invention is well satisfied when the emission is coherent but the obtainment of such emission is by no means essential to the operation of a device according to the invention although in certain embodiments it may be desirable.

The mechanical modulation means may be arranged to cause relative movement between the first semiconductor body part and the second semiconductor body part such that relative movement between the first and second p-n-junctions is effected. This relative movement between the p-n junctions will alter the incidence of the photon emission from the first p-n junction on the second p-n-junction. In a preferred embodiment of such a device the semiconductor body parts are arranged such that the first and second p-n junctions are substantially coplanar. In this arrangement the portion of the photon emission from the first p-n junction which is absorbed in the region of the second p-n junction with the consequent generation of electron-hole pairs will consist of the photons emitted in a direction corresponding substantially with the plane of the junction. Hence if the first p-n junction is operated to give coherent emission then in this arrangement the coherent emission will be directed towards the second p-n junction and due to its small effective angular spread a very small relative movement between the junctions may produce a large variation in the current through the second p-n junction.

In this device in which the first and second p-n junctions are coplanar the first and second semiconductor body parts may be supported by the mechanical modulation means consisting of a flexible diaphragm. Thus with a constant current through the first forward biased "emitter" p-n junction and sound input to the diaphragm, the current through the second "collector" p-n junction, which is reverse biased, is modulated in accordance with the flexion of the diaphragm and the device operates as a microphone.

In a device according to the invention in which the first and second semiconductor body parts are arranged such that the first and second p-n junctions are substantially coplanar, the first body part may be of circular section and the second body part of annular section co-axially surrounding the first body part. With this arrangement of the body parts the first p-n junction is co-axially surrounded by the second p-n junction so that rticularly for photons emitted by the first p-n junc-n in a direction substantially parallel to the junction ıne efficient absorption by the second p-n junction is tained. The first and second semiconductor body parts ay be so arranged on a flexible diaphragm and with und input to the diaphragm the device operated as a icrophone.

In a further embodiment of the device according to e invention the first and second semiconductor body rts are arranged such that the mechanical modulation eans are adapted to move in a space between the first d second semiconductor body parts and in the photon th between the first and second p-n junctions. In this vice the first and second semiconductor body parts ay be arranged such that the first and second p-n junc-ons are substantially coplanar. In a preferred form of ch a device the first semiconductor body part is of cir-ılar section and the second semiconductor body part is annular section coaxially surrounding the first semi-onductor body part and the mechanical modulation eans are adapted to move in the annular space between e first and second body parts. In this device the first d second body parts may or may not be relatively mov-ble and in one embodiment in which the body parts d hence the first and second p-n junctions are rela-vely fixed the first and second semiconductor body parts re integrally combined in a single semiconductor body.

The mechanical modulation means adapted to move in space between the body parts and in the photon path etween the first and second p-n junctions may comprise member having a slit or an end movable in the said hoton path. Alternatively, in order to reduce the mount of movement of a member which is required to ive sufficient modulation of the incidence of the photon mission on the second p-n junction the mechanical mod-lation means may comprise two ruled gratings, one fixed nd one movable relative to the first and second body arts. The member or the movable grating may be at-ached to a diaphragm and the edge of the diaphragm ay be rigidly attached to the first and second body arts. The device may be operated as a microphone r, by using a less flexible diaphragm and attaching a ramophone stylus to it in a suitable manner, it may be sed as a gramophone pickup.

In order to increase the available photon emission rom the first p-n junction the first semiconductor body art may be provided with a mirror deposit over por-ions of its surface and anti-reflection coatings techniques nay be applied to those parts of the surface of the body art over which emission occurs to obtain increased trans-nission. In the embodiments of the device where the wo junctions are substantially coplanar mirroring may e of less importance than in those embodiments in which he two junctions are not coplanar.

In the devices described in which the first and second ody parts are arranged such that the first and second -n junctions are substantially coplanar, it may be de-irable to construct the combination such that one junc-ion is shifted a very small amount from a position in which the junction lie exactly in the same plane in or-ler to increase the linearity of the device. In the de-ices comprising ruled gratings, the rest position should correspond to that at which about half the maximum ight transmission occurs, in order to improve the linear-ty.

The first semiconductor body part having the first, photon-emissive p-n junction may be of gallium arsenide and the junction may be formed by techniques known per se in the semiconductor art such as, alloying, diffu-sion and epitaxial growth. The second semiconductor body part having the second, photosensitive p-n junction may be of gallium arsenide and the junction may be simi-larly formed by such known techniques. Alternatively, the second, photo-sensitive p-n junction in the second semiconductor body part may be a semiconductor hetero-junction, for example between gallium arsenide and ger-manium or between gallium arsenide and a solid solution of gallium arsenide and indium arsenide or gallium anti-monide.

Embodiments of the invention will now be described, by way of example, with reference to the diagrammatic drawing accompanying the provisional specification, in which:

FIGURES 1 to 4 illustrate consecutive stages in the manufacture of a first embodiment of an opto-electronic semiconductor device according to the invention; and FIGURE 5 shows in cross-section a second embodi-ment.

A single crystal slice 1 of n-type gallium arsenide of circular section of about 1 cm., diameter and 200$\mu$ thick-ness uniformly doped with tellurium in a concentration of $10^{17}$ atoms/cc. has cadmium diffused into its surface to form a p-type region 2 (FIGURE 1) the depth of the p-n junction from the surface being about 30 microns. The unwanted parts of the p-type region 2 are then ground away from the lower surface and the slice is then ultrasonically cut into bodies each of 1 mm. diam-eter and 150$\mu$ thickness having a p-n junction 3 between the n-type region 1 and the p-type region 2 (FIGURE 2). The body is then potted in wax and an annular por-tion 4 removed by ultrasonic drilling means to leave a first body part 5 of 250$\mu$ diameter having a first, photon-emissive p-n junction 6 coaxially surrounded by a sec-ond body part 7 of 500$\mu$ internal diameter having a sec-ond, photo-sensitive p-n junction 8 lying coplanar with the p-n junction 6.

FIGURE 3 shows the body parts 5 and 7 after mount-ing on a thin molybdenum plate 10 of 1 mm., diameter and 75$\mu$ thickness. The mounting is effected by first evaporating a gold layer 11 on to the lower surface of the n-type region 1 prior to drilling out the annular por-tion 4. After drilling, any residual wax is dissolved from the surfaces of the body. The upper surface of the molybdenum plate 10 is provided with a gold layer and subsequently plated with tin and the separate body parts 5 and 7 heated in contact with the plated surface of the plate 10 to form a solder joint as shown in FIG-URE 3.

Connections to the p-type regions of the body parts 5 and 7 are made by alloying bismuth-cadmium alloy pellets to form ohmic contacts 12 and 13 therewith (FIG-URE 4). Alternatively, to form these ohmic contacts, a bismuth based alloy may be provided over the upper surface of the p-type region 2 in pellet or sheet form and alloyed thereto prior to drilling out the annular portion 4.

The plate 10 is placed centrally on an indium plated header (not shown) which has a 500$\mu$ diameter hole in the centre and the header is heated to solder the plate 10 to it.

Platinum leads (not shown) are soldered with indium to the ohmic contacts 12 and 13. The header makes contact with the n-type regions of the body parts. A cap (not shown) may be sealed over the header to en-close the junctions.

In order to use the device as a microphone the centre of a metal diaphragm of 1 cm. diameter is attached to the centre of the plate 10 with epoxy resin.

The device shown in FIGURE 4 is operated in ambient conditions. On passing a suitable forward current, for example 100 ma., through the p-n junction 6 photons are emitted in the vicinity of the junction. On applying a suitable reverse bias, for example 10 volts, to the p-n junction 8, photons which are emitted by the junction 6 in a direction shown by the arrow in FIGURE 4 and which are incident upon the second body part 7 in the neighborhood of the p-n junction 8 bounded approxi-mately by the depletion layer are absorbed and electron-hole pairs are generated with a consequent increase in current across the junction 8.

Modulation of the current across the junction 8 is effected by modulation of the incidence of the available photon emission on the junction 8 so that a variation in the incidence upon the second body part 7 in the neighborhood of the p-n junction 8 bounded by the depletion layer occurs. This is effected by the relative movement of the body parts 5 and 7 and hence the p-n junctions 6 and 8 due to the flexion of the thin molybdenum plate 10. With a constant current through the forward biased junction 6 and on applying sound input to the diaphragm, the current through the reverse biased junction 8 is modulated in accordance with the flexion of the plate 10 and the device operates as a microphone.

In the embodiment shown in FIGURE 5 the starting materials is an n-type semiconductor of gallium arsenide as shown in FIGURE 1, a p-type region is similarly formed and a body as shown in FIGURE 2 is similarly obtained after dicing. The annular portion 4 removed by ultrasonic drilling means extends only partly to a depth of 50 microns into the n-type region of the body so that in this device the first body part 15 and the second body part 16 are integrally combined in the same semiconductor body with an n-type region 4 common to both body parts.

After drilling the body is mounted on a rigid plate 19 by first coating the lower surface of the n-type region 14 with a layer 20 of gold and then heating in contact with the upper surface of the plate 19 which is tin plated, to make a solder joint. The plate 19 is then soldered to a header of 1 cm., diameter having a screw thread round the outer diameter. The ohmic contacts to the p-type region are the same as those shown in FIGURE 4.

A flexible diaphragm member 21 having an annular part 22 extending in the space between the body parts 15 and 16 and which is attached at its periphery to a ring (not shown) with an internal screw thread (not shown) is screwed onto the header. During this operation electrical connection is made to the regions of the body so that photons emitted from the p-n junction 17 in the body part 15 induce a current across the p-n junction 18 in the body part 16 and the ring is screwed down until the current across the junction 18 in the body part 16 is reduced by about 50%. The screw is then locked and the structure sealed by welding together flanges on to header and the ring. The lower ends of the annular part now extend in the photon path from the junction 17 to the junction 18. The operation of this device is similar to that shown in FIGURE 4 except that in this device the body parts and hence the p-n junctions 17 and 18 are relatively fixed and the mechanical modulation means are adapted to move in the annular space 4 between the body parts 15 and 16 and in the photon path from the junction 17 to the junction 18.

What is claimed is:

1. An opto-electronic semiconductor device comprising first semiconductive regions forming a photoemissive p-n junction capable when suitably biased in the forward direction of generating photons along a path generally in the plane of the junction, second semiconductive regions forming a photosensitive p-n junction for detecting photons and converting them into electrical energy, said photoemissive and photosensitive p-n junctions being substantially planar, support means for said first and second semiconductive regions, said first and second semiconductive regions being arranged on said support means such that the said photoemissive and photosensitive p-n junctions extend substantially in a common plane but are spaced from one another so as to define an open space inbetween to which the junctions extend, and mechanical shutter means mounted for movement in the open space in the common plane between the photoemissive and photosensitive junctions so as to controllably attenuate or block the photon path between the said junctions in accordance with its movement.

2. An opto-electronic semiconductor device as set forth in claim 1 wherein the photosensitive junction has an annular configuration which surrounds the photoemissive junction forming an annular space within which the shutter means is arranged for movement.

3. An opto-electronic semiconductor device as set forth in claim 1 wherein the support means comprises a common semiconductive body integrally united with the first and second semiconductive regions.

4. An opto-electronic semiconductor device as set forth in claim 3 wherein the first and second semiconductive regions and the support are all of gallium arsenide.

5. An opto-electronic semiconductor device comprising first semiconductive regions forming a photoemissive p-n junction capable when suitably biased in the forward direction of generating photons along a path generally in the plane of the junction, second semiconductive regions forming a photosensitive p-n junction for detecting photons and converting them into electrical energy, said photoemissive and photosensitive p-n junctions being substantially planar, and support means for said first and second semiconductive regions, said first and second semiconductive regions being arranged on said support means such that the said photoemissive and photosensitive p-n junctions extend substantially in a common plane but are spaced from one another so as to define an open space inbetween to which the junctions extend, said support means being flexible allowing for relative movement between the photoemissive and photosensitive junctions in a direction generally perpendicular to their planes so as to controllably modulate the detection of photons by the photosensitive junction.

6. An opto-electronic semiconductor device as set forth in claim 5 wherein the photosensitive junction has an annular configuration which surrounds the photoemissive junction forming an annular space within which the photons pass.

References Cited by the Examiner

UNITED STATES PATENTS

| | | | |
|---|---|---|---|
| 2,958,786 | 11/1960 | Millis | 250—232 |
| 3,043,958 | 7/1962 | Diemer | 250—217 |
| 3,111,587 | 11/1963 | Rocard | 317—235 |
| 3,229,104 | 1/1966 | Rutz | 250—217 |

WALTER STOLWEIN, *Primary Examiner.*